(12) United States Patent
Tanabe et al.

(10) Patent No.: US 6,893,971 B2
(45) Date of Patent: May 17, 2005

(54) DRY ETCHING METHOD AND APPARATUS

(75) Inventors: Hiroshi Tanabe, Yamatotakada (JP); Tomohiro Okumura, Kadoma (JP); Hiroshi Imai, Kyoto (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 82 days.

(21) Appl. No.: 10/197,465

(22) Filed: Jul. 18, 2002

(65) Prior Publication Data

US 2003/0066817 A1 Apr. 10, 2003

(30) Foreign Application Priority Data

Jul. 19, 2001 (JP) ........................................ 2001-219642

(51) Int. Cl.[7] .......................................... H01L 21/302
(52) U.S. Cl. ........................ 438/706; 438/710; 438/712; 438/714; 216/58
(58) Field of Search ................................ 438/700, 706, 438/710, 712, 714, 720; 156/345.48, 345.52, 345, 643.1; 216/58, 67

(56) References Cited

U.S. PATENT DOCUMENTS 5,683,548 A * 11/1997 Hartig et al. ............... 438/729
5,877,032 A * 3/1999 Guinn et al. .................... 438/9
6,439,154 B2 * 8/2002 Fukuda et al. ............ 118/723 I
6,579,802 B1 * 6/2003 Pierson et al. .............. 438/706

OTHER PUBLICATIONS

C.Y. Chang & S.M. Sze, entitled "*ULSI Technology*", McGraw–Hill Series in Electrical and Computer Engineering, issued in 1996, p. 351.

* cited by examiner

*Primary Examiner*—Lan Vinh
(74) *Attorney, Agent, or Firm*—Wenderoth, Lind & Ponack, L.L.P.

(57) ABSTRACT

A dry etching method and apparatus are provided which are capable of performing deep etching fabrication rapidly on a substrate of an InP-based compound semiconductor. Etching gas is fed into and exhausted from a reaction chamber so that an interior of the chamber is controlled to be under a predetermined pressure. Plasma is then generated in the reaction chamber by application of at least 13.56 MHz high-frequency power to a flat spiral discharge coil or a flat antenna that is provided so as to face an InP-based compound semiconductor substrate placed on a substrate electrode in the reaction chamber, and the substrate is etched while a density of the plasma and ion energy that reaches the substrate are controlled.

20 Claims, 11 Drawing Sheets

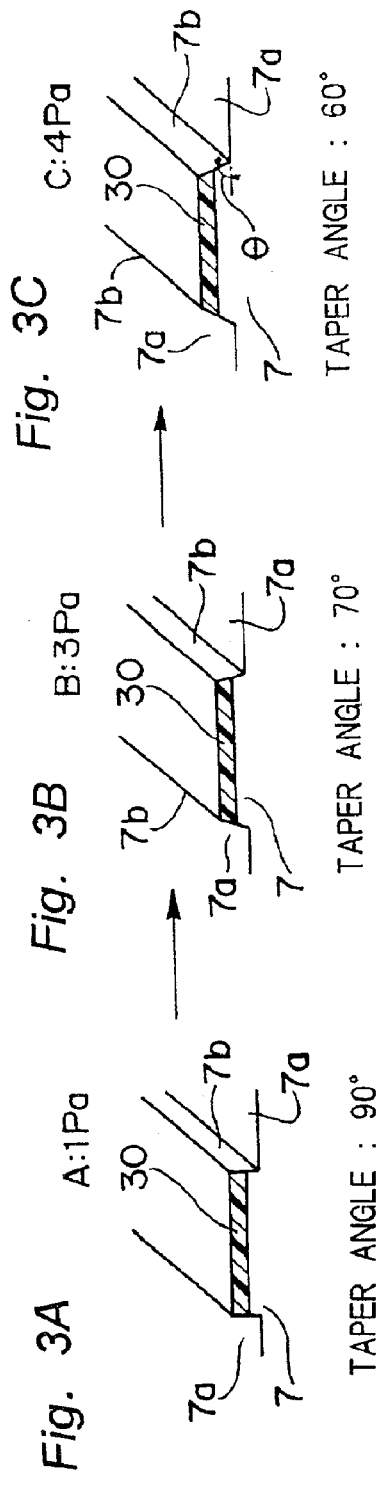
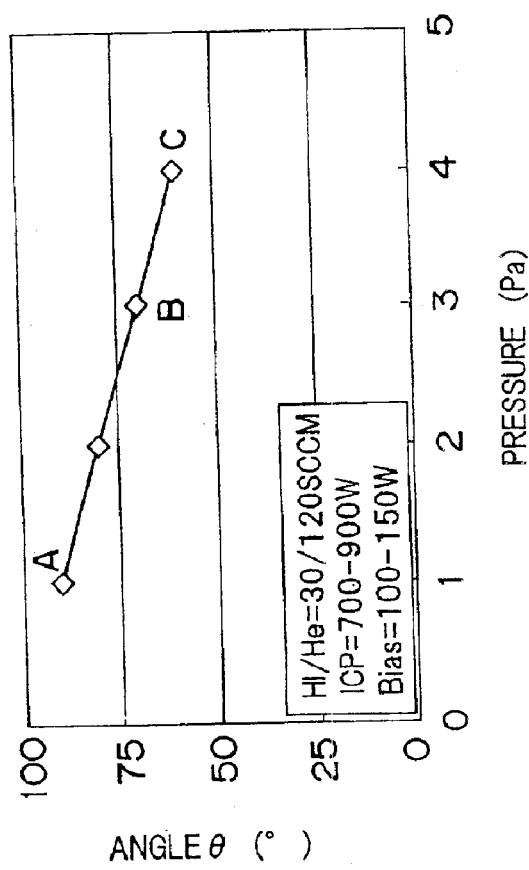
Fig. 3A  Fig. 3B  Fig. 3C  Fig. 3D

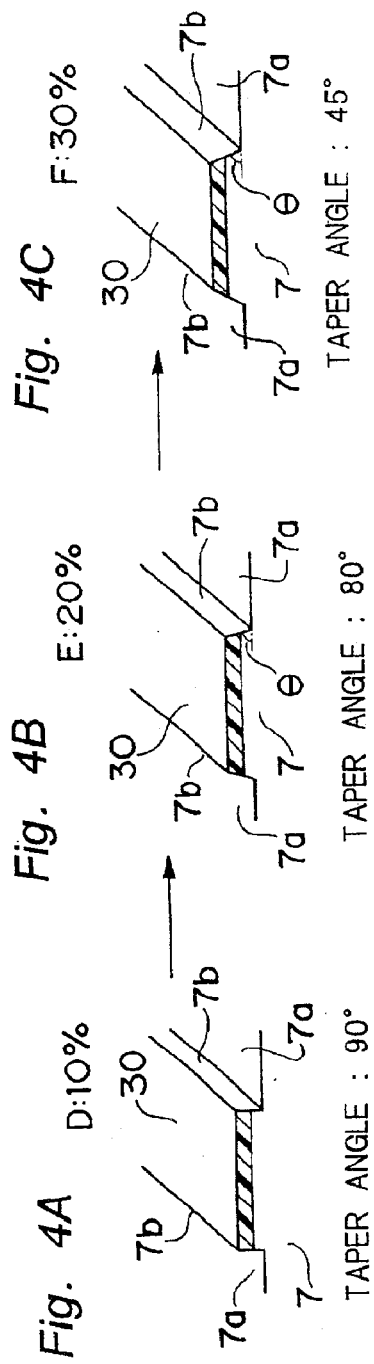
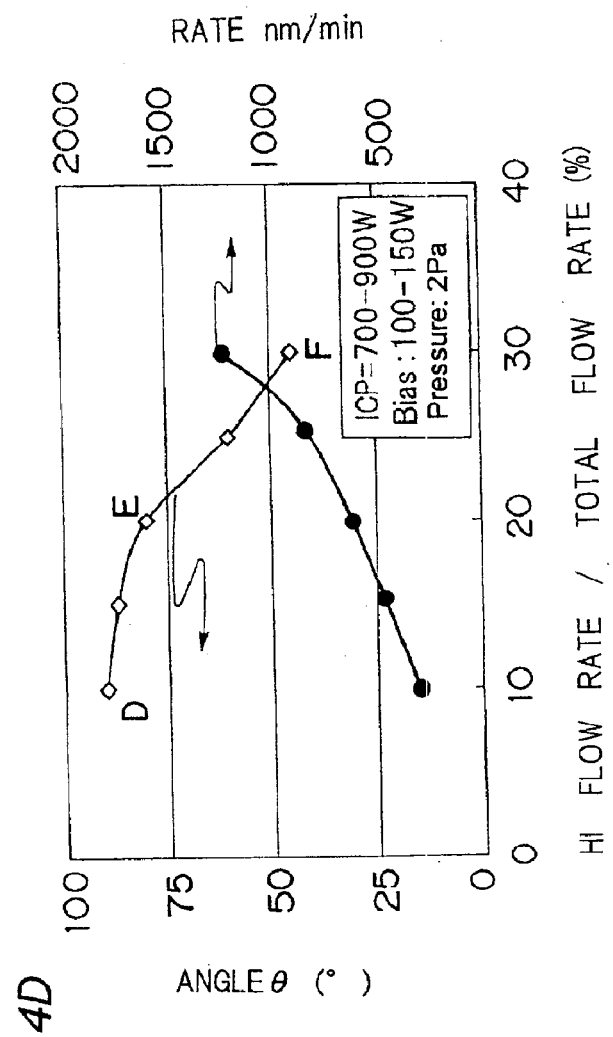

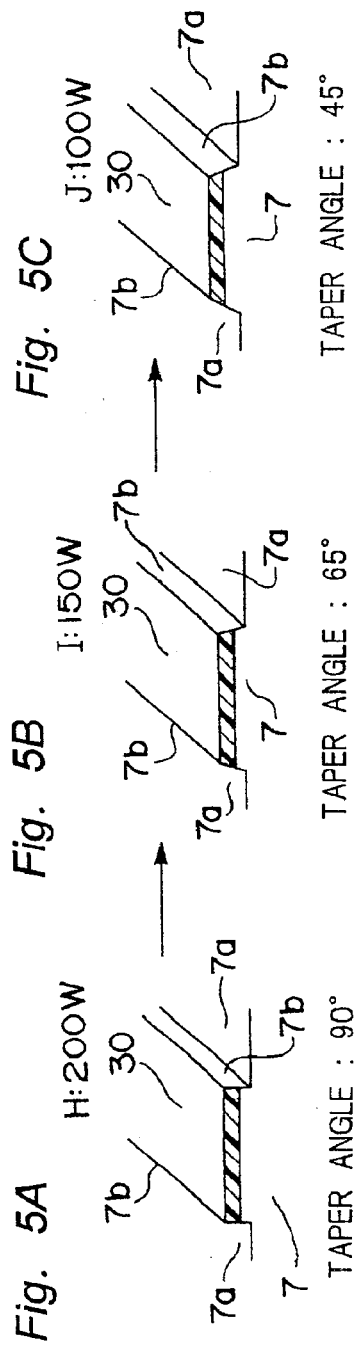
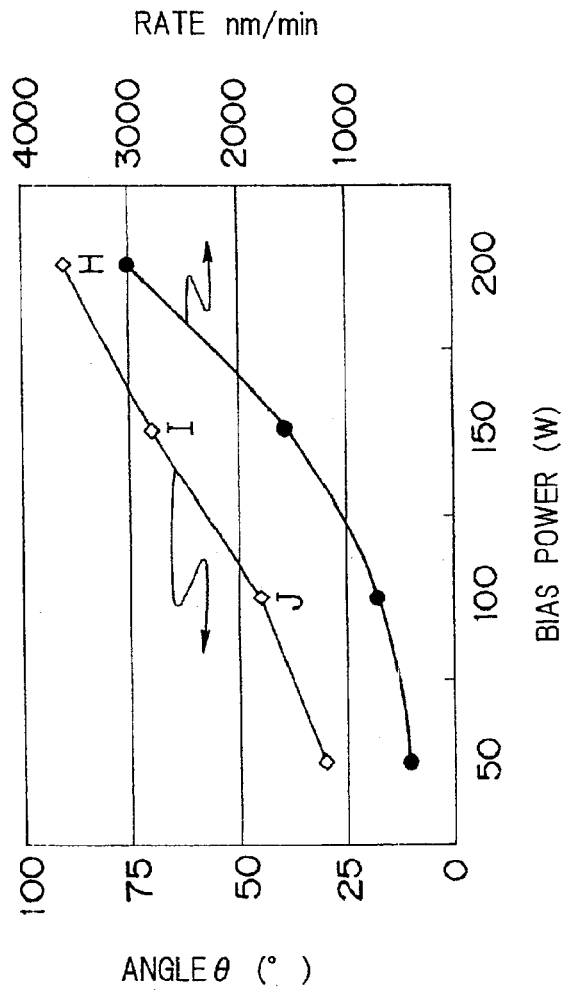
Fig. 5A  Fig. 5B  Fig. 5C  Fig. 5D

DRY ETCHING METHOD AND APPARATUS

BACKGROUND OF THE PRESENT INVENTION

The present invention relates to a process of manufacturing a compound semiconductor, relates to a dry etching method for fabricating an InP or epitaxially grown thin film thereof with satisfactory controllability and anisotropically, and particularly relates to a dry etching method and apparatus using ions generated by an induction coupling plasma (ICP) source or plasma having a high frequency in bands of VHF, UHF, and the like.

Etching fabrication techniques for a compound semiconductor are used for manufacturing various compound semiconductor elements such as a semiconductor laser and an optical modulator. Though wet etching has been employed for etching of a compound semiconductor for a long time, increasing demand for improvement in uniformity of fabrication dimensions in wafer surfaces in recent years has promoted studies of dry etching techniques.

Because of demand for miniaturization of, and dry processes for, such compound semiconductor devices, etching techniques superior in microfabrication properties and selectivity of types of material, and controllability of high-speed processes or etching shapes have become particularly important in processes of manufacturing HBT (Heterojunction Bipolar Transistor), HEMT (High Electron Mobility Transistor) and the like that have been increasing in performance with miniaturization.

As dry etching methods for a compound semiconductor as prior art have been used reactive ion etching (RIE), reactive ion beam etching (RIBE), and the like with use of mixed gas of chlorine-based gas and an inert gas such as argon, mixed gas of methane or halomethane and hydrogen, or the like.

Control of anisotropy of fabrication shape, however, requires supply of considerable electric power, which may cause plasma damage on surfaces of substrates or thin films and may make it difficult to ensure flatness (specularity) of the surfaces.

For via hole fabrication that is extremely important for high-speed operation (electron mobility) of HEMT devices using InP, on the other hand, deep etching fabrication is required, for example, with a depth of at least not less than 20 $\mu$m, more preferably, not less than 100 $\mu$m. In other words, a highly selective process is required and high-speed etching is indispensable for a resist mask; however, it is difficult to perform such treatment within a desired period of time with RIE plasma of the mixed gas of methane or halomethane and hydrogen. In addition, it has conventionally been difficult to obtain satisfactory fabrication shapes in etching of InP material with chlorine-based gas, because a vapor pressure of chloride of In has been low.

Therefore, an object of the present invention is to solve issues described above and to provide a dry etching method and apparatus that are capable of performing deep etching fabrication rapidly on a substrate of an InP-based compound semiconductor.

SUMMARY OF THE PRESENT INVENTION

In order to achieve the object, the present invention is configured as follows.

According to a first aspect of the present invention, there is provided a dry etching method in which etching gas is fed into a reaction chamber and exhaust of the reaction chamber is performed so that an interior of the reaction chamber is controlled to be under a predetermined pressure, in which plasma is then generated in the reaction chamber by application of at least 13.56 MHz high-frequency power to a flat spiral discharge coil that is provided so as to face an InP-based compound semiconductor substrate placed on a substrate electrode in the reaction chamber, in which the InP-based compound semiconductor substrate is etched while a density of the plasma is controlled by the high-frequency power applied to the discharge coil and while ion energy that reaches the InP-based compound semiconductor substrate is controlled by application of a high-frequency voltage to the substrate electrode by a high-frequency power source for the substrate electrode, with such ion energy control being independent from plasma density control, and in which mixed gas of hydrogen iodide (HI) gas and an inert gas is used as an etching gas.

According to a second aspect of the present invention, there is provided a dry etching method in which etching gas is fed into a reaction chamber and exhaust of the reaction chamber is performed so that an interior of the reaction chamber is controlled to be under a predetermined pressure, in which plasma is then generated in the reaction chamber by application of at least 13.56 MHz high-frequency power to a flat antenna that is provided so as to face an InP-based compound semiconductor substrate placed on a substrate electrode in the reaction chamber, in which the InP-based compound semiconductor substrate is etched while a density of the plasma is controlled by the high-frequency power applied to the antenna and while ion energy that reaches the InP-based compound semiconductor substrate is controlled by application of a high-frequency voltage to the substrate electrode by a high-frequency power source for the substrate electrode, with such ion energy control being independent from plasma density control, and in which mixed gas of gas containing chlorine or hydrogen bromide or hydrogen chloride and an inert gas is used as an etching gas.

According to a third aspect of the present invention, there is provided a dry etching method as defined in the first or second aspect, wherein an angle of inclination of via holes or recesses that are formed in the InP-based compound semiconductor substrate by etching is changed with use of different types of gas as the etching gas.

According to a fourth aspect of the present invention, there is provided a dry etching method as defined in the first aspect, wherein an angle of inclination of via holes or recesses that are formed in the substrate by etching is changed with use, as the etching gas, a gas that is selected from a group consisting of inert gas, gas containing $Cl_2$, gas containing $BCl_3$, gas containing HBr, and gas containing HCl, with this selected gas being added to hydrogen iodide gas.

According to a fifth aspect of the present invention, there is provided a dry etching method as defined in the second aspect, wherein an angle of inclination of via holes or recesses that are formed in the substrate by etching is changed with use, as the etching gas, a gas that is selected from a group consisting of inert gas, gas containing $BCl_3$, gas containing HBr, and gas containing HCl, with this selected gas added to gas containing $Cl_2$.

According to a sixth aspect of the present invention, there is provided a dry etching method as defined in any one of the first to fifth aspects, wherein a frequency of the high-frequency power that is applied to the discharge coil or the antenna is any one of 27.12 MHz, 40.68 MHz, 60 MHz, 80 MHz, and 100 MHz.

According to a seventh aspect of the present invention there is provided a dry etching method as defined in the first or fourth aspect, wherein an angle of inclination of via holes or recesses in the InP-based compound semiconductor substrate below a resist mask is controlled within a range of 90° to 60° by adjustment of a degree of vacuum in the reaction chamber within a range of 1 Pa to 4 Pa.

According to an eighth aspect of the present invention, there is provided a dry etching method as defined in the first or fourth aspect, wherein an angle of inclination of via holes or recesses in the InP-based compound semiconductor substrate below a resist mask is controlled within a range of 90 to 45 and an etching rate is controlled within a range of 300 nm/min to 1250 nm/min by adjustment of (flow rate of HI/mixed gas total flow rate) of the mixed gas within a range of 10% to 30%.

According to a ninth aspect of the present invention, there is provided a dry etching method as defined in the first or fourth aspect, wherein an angle of inclination of via holes or recesses in the InP-based compound semiconductor substrate below a resist mask is controlled within a range of 90° to 45° and an etching rate is controlled within a range of 3000 nm/min to 800 nm/min, by adjustment of a bias high-frequency power applied to the InP-based compound semiconductor substrate within a range of 200 W to 100 W.

According to a tenth aspect of the present invention, there is provided a dry etching method as defined in the first or fourth aspect, wherein an angle of inclination of via holes or recesses in the InP-based compound semiconductor substrate below a resist mask is controlled within a range of 50 to 90 and an etching rate is controlled within a range of 0.5 $\mu$m/min to 5 $\mu$m/min by adjustment of a frequency of the high-frequency power applied to the discharge coil within a range of 13.6 MHz to 100 MHz.

According to an eleventh aspect of the present invention, there is provided a dry etching method as defined in the second or fifth aspect, wherein an angle of inclination of via holes or recesses in the InP-based compound semiconductor substrate below a resist mask is controlled within a range of 50° to 80° and an etching rate is controlled within a range of 1100 nm/min to 2000 nm/min by adjustment of a surface temperature of the InP-based compound semiconductor substrate within a range of 50° C. to 150° C.

According to a twelfth aspect of the present invention, there is provided a dry etching method as defined in any one of the first to eleventh aspects, wherein a frequency of the high-frequency power that is applied to the discharge coil or the antenna is a frequency in a UHF band from 300 MHz to 3 GHz.

According to a thirteenth aspect of the present invention, there is provided a dry etching method as defined in any one of the first to twelfth aspects, wherein a frequency of a bias that is applied to the substrate is not more than 13.56 MHz.

According to a fourteenth aspect of the present invention, there is provided a dry etching method as defined in any one of the first to twelfth aspects, wherein a frequency of a bias that is applied to the substrate is any one of 13.56 MHz, 2 MHz, 800 kHz, and 500 kHz.

According to a fifteenth aspect of the present invention, there is provided a dry etching method as defined in any one of the first to fifth and twelfth to fourteenth aspects, wherein the substrate is subjected to dry etching in a high-vacuum zone with a degree of vacuum between 0.1 Pa and 0.5 Pa in the reaction chamber.

According to a sixteenth aspect of the present invention, there is provided a dry etching method as defined in the first to fifth and twelfth to fourteenth aspects, wherein a degree of vacuum in the reaction chamber is in a pressure zone of 0.3 Pa.

According to a seventeenth aspect of the present invention, there is provided a dry etching method as defined in the first aspect, wherein a frequency of the high-frequency power that is applied to the antenna is 13.56 MHz, wherein a frequency of bias high-frequency power that is applied to the substrate is 13.56 MHz, wherein at least 100 $\mu$m deep etching fabrication in a region of the substrate on which a resin resist mask does not reside is performed with use, as the etching gas, a gas that is selected from a group consisting of inert gas, gas containing $Cl_2$, gas containing $BCl_3$, gas containing HBr, and gas containing HCl, with this selected gas being added to hydrogen iodide, and wherein slopes having an angle of inclination between 90 and 70 degrees are formed with etching fabrication in via holes or recesses in the region on which the resin resist mask does not reside.

According to an eighteenth aspect of the present invention, there is provided a dry etching method as defined in the second aspect, wherein: a frequency of the high-frequency power that is applied to the discharge coil is 100 MHz; a frequency of bias high-frequency power that is applied to the substrate is 500 kHz; at least 100 $\mu$m deep etching fabrication in a region of the substrate on which a resin resist mask does not reside is performed with use, as the etching gas, a gas that is selected from a group consisting of inert gas, gas containing $BCl_3$, gas containing HBr, and gas containing HCl, with this selected gas being added to gas containing $Cl_2$; and slopes having an angle of inclination between 90 and 70 degrees are formed with etching fabrication in via holes or recesses in the region on which the resin resist mask does not reside.

According to a nineteenth aspect of the present invention, there is provided a dry etching method as defined in any one of the first to eighteenth aspects, wherein a surface temperature of the substrate is in a temperature range in which a resin resist can be used.

According to a twentieth aspect of the present invention there is provided a dry etching apparatus, comprising:

a reaction chamber;

a gas feeding device for feeding into the reaction chamber mixed gas that is of hydrogen iodide gas and an inert gas, and used as etching gas;

an exhaust device for exhausting the reaction chamber;

a high-frequency power applying device for applying at least 13.56 MHz high-frequency power to a flat spiral discharge coil that is provided so as to face an InP-based compound semiconductor substrate placed on a substrate electrode in the reaction chamber;

a high-frequency voltage applying device for the substrate electrode for applying a high-frequency voltage to the substrate electrode by a high-frequency power source for the substrate electrode; and a control device that controls a pressure in the reaction chamber to a predetermined value by feeding of the mixed gas of the hydrogen iodide gas and the inert gas into the reaction chamber via the gas feeding device and by exhausting gas from the reaction chamber via the exhaust device, that causes plasma to be generated in the reaction chamber by application of the at least 13.56 MHz high-frequency power to the flat spiral discharge coil by the high-frequency power applying device, and that subjects the InP-based compound semiconductor substrate to etching while controlling a density of the plasma generated by the high-frequency power applied to the discharge coil or antenna and while controlling ion energy that reaches the InP-based compound semiconductor substrate by application of the high-frequency voltage to the substrate electrode via the high-frequency voltage applying device for the substrate electrode and the high-frequency power source for the substrate electrode, with such plasma density control being independent from the ion energy control.

According to a twenty first aspect of the present invention, there is provided a dry etching apparatus, comprising:

a reaction chamber;

a gas feeding device for feeding into the reaction chamber mixed gas that is of gas containing chlorine or hydrogen bromide or hydrogen chloride and an inert gas, and used as etching gas;

an exhaust device for exhausting the reaction chamber;

a high-frequency power applying device for applying at least 13.56 MHz high-frequency power to a flat spiral discharge coil or antenna that is provided so as to face an InP-based compound semiconductor substrate placed on a substrate electrode in the reaction chamber;

a high-frequency voltage applying device for the substrate electrode for applying a high-frequency voltage to the substrate electrode by a high-frequency power source for the substrate electrode; and a control device that controls a pressure in the reaction chamber to a predetermined value by feeding of the mixed gas of the gas containing chlorine or hydrogen bromide or hydrogen chloride and the inert gas into the reaction chamber via the gas feeding device and by exhausting gas from the reaction chamber via the exhaust device, that causes plasma to be generated in the reaction chamber by application of the at least 13.56 MHz high-frequency power to the flat antenna by the high-frequency power applying device, and that subjects the InP-based compound semiconductor substrate to etching while controlling a density of the plasma generated by the high-frequency power applied to the antenna and while controlling ion energy that reaches the InP-based compound semiconductor substrate by application of the high-frequency voltage to the substrate electrode via the high-frequency voltage applying device for the substrate electrode and the high-frequency power source for the substrate electrode, with the plasma density control being independent from the ion energy control.

BRIEF DESCRIPTION OF THE DRAWINGS

These and other aspects and features of the present invention will become clear from the following description taken in conjunction with the preferred embodiments thereof with reference to the accompanying drawings, in which:

FIG. 3A, FIG. 3B, FIG. 3C, and FIG. 3D are views showing a relationship between pressures and angles of inclination of via holes or recesses in an InP substrate below a resist mask in the dry etching apparatus for practicing the dry etching method of the first embodiment;

FIG. 4A, FIG. 4B, FIG. 4C, and FIG. 4D are views showing a relationship between (flow rate of HI/total flow rate) and angles of inclination of via holes or recesses in an InP substrate below a resist mask, and a relationship between (flow rate of HI/total flow rate) and etching rates in the dry etching apparatus for practicing the dry etching method of the first embodiment;

FIG. 5A, FIG. 5B, FIG. 5C, and FIG. 5D are views showing a relationship between bias high-frequency powers applied to an InP substrate and angles of inclination of via holes or recesses in the InP substrate below a resist mask, and a relationship between bias high-frequency powers applied to the substrate and etching rates in the dry etching apparatus for practicing the dry etching method of the first embodiment;

DETAILED DESCRIPTION OF THE PREFERRED EMBODIMENTS

Figure 1:
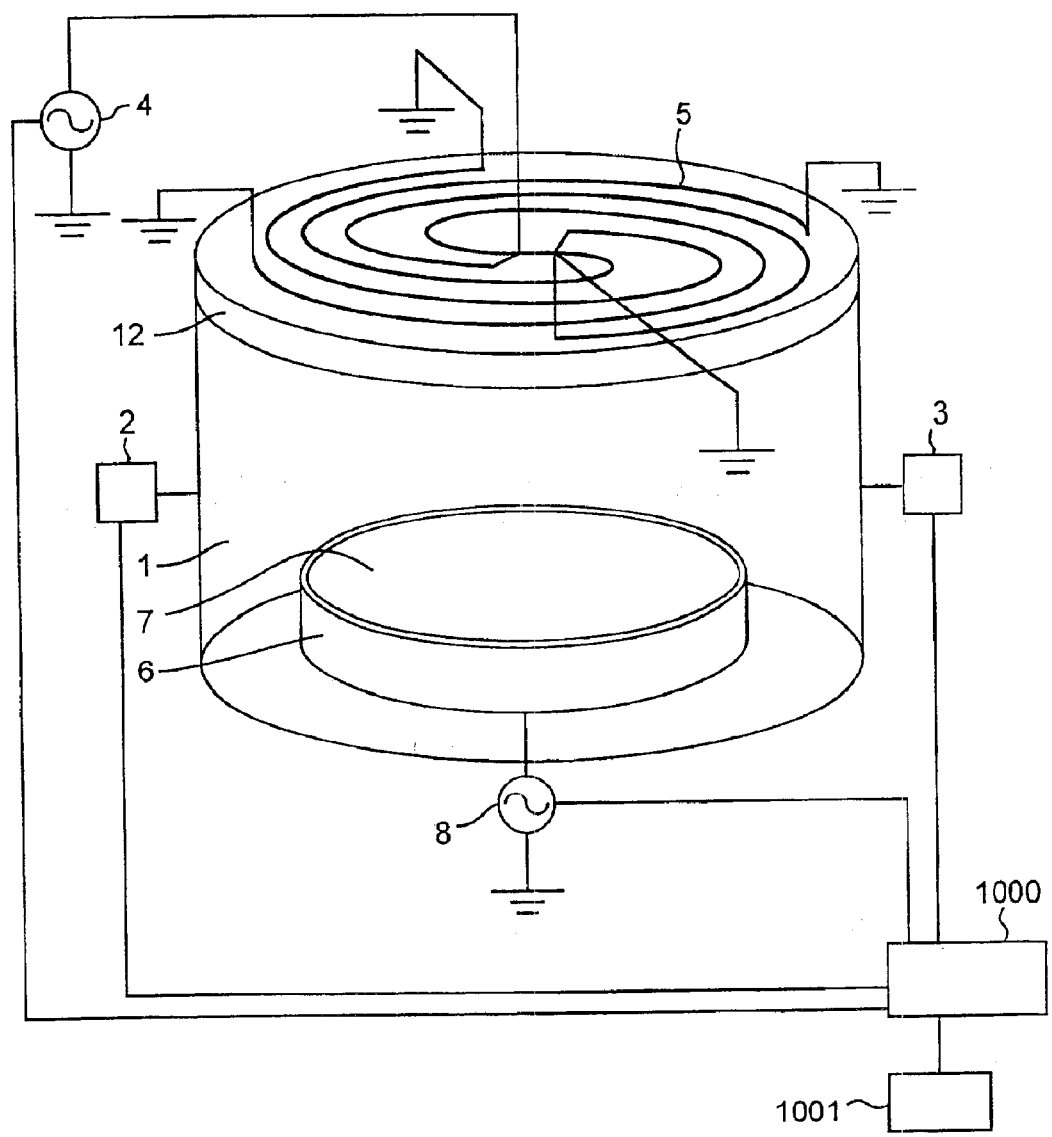
FIG. 1 is a schematic illustration of a dry etching apparatus for practicing a dry etching method of a first embodiment of the present invention.

Before description of the present invention proceeds, it is to be noted that like parts are designated by like reference numerals throughout the accompanying drawings.

Hereinbelow, embodiments of the present invention will now be described in detail with reference to the drawings.

As a dry etching apparatus for practicing a dry etching method of a first embodiment of the present invention is used an apparatus shown in FIG. 1. In FIG. 1, predetermined gas is introduced into a vacuum chamber 1 as an example of a reaction chamber, from a gas feeding device 2 and exhaust of the reaction chamber is performed by a pump 3, as an example of an exhaust device, so that an interior of the vacuum chamber 1 is held under a predetermined pressure. A multi-spiral coil (a flat spiral discharge coil) 5 on a dielectric plate 12 of quartz or the like is supplied with predetermined high-frequency power (e.g., with a frequency of 13.56 MHz) by a high-frequency power source 4 for the discharge coil, and plasma is then produced in the vacuum chamber 1 so that plasma treatment, e.g., dry etching, deposition, surface reforming or the like can be executed on a substrate (a wafer) 7 of an InP-based compound semiconductor located on a substrate electrode 6. In this first embodiment, plasma treatment is executed for performing an etching treatment. In this case, ion energy that reaches the substrate 7 can be controlled by supply of high-frequency power to the substrate electrode 6 from a high-frequency power source 8 for the substrate electrode. Thus, high-density plasma is produced, the substrate 7 is provided with a bias potential, and a density of the plasma and the bias potential are independently controlled. In FIG. 1 is shown an example in which a multi-spiral coil is used as the flat spiral discharge coil 5. In the discharge coil 5, four spiral discharge coils are united at central positions thereof and are spaced at uniform intervals circumferentially, wherein the central positions are connected to the high-frequency power source 4, and outer peripheral ends thereof are grounded respectively.

As the gas that is introduced into the vacuum chamber 1 from the gas feeding device 2, in other words, as etching gas, may be used gas that is selected from five types of gas: inert gas, gas containing $Cl_2$, gas containing $BCl_3$, gas, containing HBr, and gas containing HCl in addition to hydrogen iodide gas, i.e., mixed gas of hydrogen iodide gas and inert gas, mixed gas of hydrogen iodide gas and gas containing $Cl_2$, mixed gas of hydrogen iodide gas and gas containing $BCl_3$, mixed gas of hydrogen iodide gas and gas containing HBr, or mixed gas of hydrogen iodide gas and gas containing HCl. Appropriate selection of type of these gases makes it possible to form a fabrication shape that is to be formed by etching, for example, an angle of inclination of slopes (sloping surfaces) 7b (an angle θ the slopes 7b of the substrate 7 form with a plane parallel to a surface of the substrate) in formation of via holes or recesses 7a at a desired angle in a region of the substrate 7 on which no resin resist mask 30 resides. In performance of the etching treatment, change of type of the gas makes it possible to change the angle θ of inclination of the via hole or recess 7a that is formed by etching in the region of the substrate 7 on which no resin resist mask 30 resides. For example, deep etching may initially be performed in a direction orthogonal to the surface of the substrate 7, then different gas may be introduced in vicinity of a bottom section, and slopes inclined gently relative to the orthogonal direction may be formed at corners of the bottom section. With appropriate selection of types of the gases in performance of the etching treatment, surfaces orthogonal to the surface of the substrate 7 and slopes having various angles of inclination can be combined arbitrarily in the region of the surface of the substrate 7 on which no resin resist mask 30 resides, and a desired fabrication shape can thereby be formed.

As high-frequency power that is applied by the high-frequency power source 4 for the discharge coil, as the high-density plasma source, may be applied frequencies not lower than 13.56 MHz, to be more specific, frequencies of 13.56 MHz, 27.12 MHz, 40.68 MHz, 60 MHz, 80 MHz, 100 MHz, or UHF frequencies from 300 MHz to 3 GHz. Practically, 13.56 MHz is most preferable for the dry etching method and apparatus according to the first embodiment.

On the other hand, a bias voltage with a frequency not higher than 13.56 MHz may be applied to the substrate electrode 6 by the high-frequency power source 8 for substrate electrode. To be more specific, 13.56 MHz, 2 MHz, 800 kHz, and 500 kHz may be used as the frequency of the bias voltage that is applied to the substrate electrode 6. Among those, practically, 500 kHz, that can maximize an etching rate, is preferable for the dry etching method and apparatus according to the first embodiment.

The substrate 7 is subjected to dry etching in a high-vacuum zone with a degree of vacuum between 0.1 Pa and 0.5 Pa or less in the reaction chamber 1. More specifically, a pressure zone with a degree of vacuum of 0.3 Pa is preferable in the reaction chamber 1 with frequencies of 100 MHz and 500 kHz.

The etching treatment may basically be performed at ordinary temperatures. The plasma treatment, however, can be performed more quickly than at ordinary temperatures, on condition that the substrate electrode 6 is heated so that the substrate 7 has a surface temperature, e.g., in a range of from 200° C. to 250° C.

In a specific example, a frequency of the high-frequency power that is applied to the discharge coil is VHF 100 MHz, a frequency of the bias high-frequency power that is applied to the substrate is 500 kHz and, for example, slopes 7b having an angle of inclination of 70 degrees can be formed with etching fabrication in via holes or recesses 7a in a region on which a resin resist mask 30 having a thickness of 40 µm does not reside, on condition that a mixed gas of gas containing chlorine and an inert gas is used as etching gas. In another example, a frequency of the high-frequency power that is applied to the discharge coil is between 13.56 MHz and 100 MHz, a frequency of the bias high-frequency power that is applied to the substrate is 13.56 MHz and, for example, slopes 7b having an angle of inclination between 50 and 90 degrees can be formed with etching fabrication in via holes or recesses 7a in a region on which a resin resist mask 30 does not reside, on condition that a mixed gas of hydrogen iodide gas and an inert gas is used as etching gas. In both cases, at least 100 µm deep etching fabrication can be performed at an etching rate of at least 1000 nm/min.

Conventionally, by contrast, deep etching fabrication can be executed by no more than 50 µm, and etching rates no more than below 1 µm/min (e.g., on the order of 0.05 to 0.7 µm/min) can be achieved even with heating up to about 200° C., so that it takes one hour and a half to execute 50 µm deep etching fabrication.

InP-based compound semiconductor substrates produced by the etching method may be applied to optodevices, devices for laser, electronic devices, and the like, and more specific examples of the application include devices for high-speed radio communication.

In accordance with the first embodiment, high-frequency power of at least 13.56 MHz is applied to the flat spiral discharge coil 5, and a high-frequency voltage is applied to the substrate electrode 6 by the high-frequency power source 8 for the substrate electrode. Both are independently controlled, and etching gas is appropriately selected. Thus, at least 20 μm deep etching fabrication that has practically been unachievable in conventional RIE plasma treatment and, more preferably, at least 100 μm deep etching fabrication can rapidly be performed for the InP-based compound semiconductor substrate 7. In conventional RIE plasma treatment, an upper electrode is grounded, high-frequency power of 13.56 MHz is applied to the substrate, and an etching rate is increased to about 10 nm/min by treatment at a high temperature of 250° C. with mixed gas of $CH_4$ and $H_2$; however, 10 nm/min is too low for deep etching fabrication and makes practically impossible deep etching fabrication of at least 20 μm, more preferably, at least 100 μm. In the first embodiment, by contrast, an etching rate can be increased to several tens or several hundreds of times the conventional rate (for example, to 1000 nm/min).

Control of operations of devices 2, 3, 4, 8, and the like in the dry etching apparatus in accordance with the first embodiment is constituted so as to be executed automatically by a control device 1000. On condition that pertinent information illustrated in FIG. 3A through FIG. 6 has been stored in a memory 1001 of the control device 1000 in advance, an operator is capable of making the apparatus execute dry etching, for example, at a desired angle of inclination or a desired etching rate on basis of the pertinent information, in control of the angle θ of inclination and the like under various conditions that will be described later.

High temperatures on the order of 250° C. for increase in rate of treatment require 20 μm of $SiO_2$ as a mask to be formed on a surface of an InP-based compound semiconductor substrate during an additional CVD process, because a resistible temperature of a resist mask placed on the surface of the substrate and made of resin is as low as on the order of 120 to 130° C. Thus, the additional CVD process is conventionally required. By contrast, the first embodiment can be practiced even in a temperature range such as ordinary temperature in which a resin resist can be used, and thus, allows a resist mask 30 made of resin to be adequately used and avoids a necessity to form an $SiO_2$ mask by performing a CVD process, thereby avoiding necessity of the additional CVD process.

In accordance with the above method, a mirror finish of the surface of the substrate 7 can be achieved and thus a damageless method can be attained.

In accordance with the above method, switches of etching gas to gas of a different type in performance of the etching treatment make it possible to change angle θ of inclination of the via hole or recess 7a that is formed in the substrate 7, and then make it possible to control fabrication shape into a desired shape.

Hereinbelow, working examples of the dry etching apparatus and method of the first embodiment will be described.

In an example, a frequency of high-frequency power that is applied to the discharge coil is 13.56 MHz, a frequency of bias high-frequency power that is applied to a substrate is 13.56 MHz, gas that is selected from five types of gas of inert gas, gas containing $Cl_2$, gas containing $BCl_3$, gas containing HBr, and gas containing HCl, with this selected gas being added to hydrogen iodide (HI) is used as etching gas, at least 100 μm deep etching fabrication is thus performed at most 140° C. in a region of the substrate on which a resin resist mask does not reside, and slopes having an angle of inclination between 90 and 70 degrees are formed by etching fabrication in via holes or recesses in the region on which the resin resist mask does not reside. An etching rate in this process is not larger than 2 μm/min. Hydrogen iodide (HI) is used because fabricability on InP (in other words, fabricability in terms of etching rate, shape control, and condition of a fabricated surface) is thereby improved greatly. Fabrication can be performed at low temperatures not higher than 140° C. (e.g., 100° C. to 150° C.), resin resist masks having resistible temperatures from 140° C. to 150° C. can therefore be used instead of expensive masks made of metal, cost of masks is reduced, and mass production is facilitated.

In the dry etching apparatus of the first embodiment, as shown in FIG. 3D for example, where high-frequency power applied to the discharge coil is from 700 to 900 W, where bias high-frequency power applied to an InP substrate is from 100 to 150 W, and where flow rates of mixed gas HI/He are 30/120 SCCM, an angle of inclination of via holes or recesses in the InP substrate below a resist mask changes from 90° (point A in FIG. 3D: see FIG. 3A) through 70° (point B in FIG. 3D: see FIG. 3B) to 60° (point C in FIG. 3D: see FIG. 3C) as a degree of vacuum in the reaction chamber 1 changes from 1 Pa (point A in FIG. 3D: see FIG. 3A) through 3 Pa (point B in FIG. 3D: see FIG. 3B) to 4 Pa (point C in FIG. 3D: see FIG. 3C).

Accordingly, the angle θ of inclination of the via holes or recesses in the InP substrate below the resist mask can be controlled within the range of 90° to 60° by adjustment of a degree of vacuum in the reaction chamber 1 within a range of 1 Pa to 4 Pa.

In the dry etching apparatus of the first embodiment, as shown in FIG. 4D, where high-frequency power applied to the discharge coil is from 700 to 900 W, where bias high-frequency power applied to an InP substrate is from 100 to 150 W, and where a degree of vacuum in the reaction chamber 1 is 2 Pa, an angle θ of inclination of via holes or recesses in the InP substrate below a resist mask changes from 90° (point D in FIG. 4D: see FIG. 4A) through 80° (point E in FIG. 4D: see FIG. 4B) to 45° (point F in FIG. 4D: see FIG. 4C) as (flow rate of HI/total flow rate) (%) of the mixed gas (where total flow rate is flow rate of HI plus flow rate of He) changes from 10% (point D in FIG. 4D: see FIG. 4A) through 20% (point E in FIG. 4D: see FIG. 4B) to 30% (point F in FIG. 4D: see FIG. 4C). On the same condition, an etching rate changes from 300 nm/min (point D in FIG. 4D: see FIG. 4A) through 600 nm/min (point E in FIG. 4D: see FIG. 4B) to 1250 nm/min (point F in FIG. 4D: see FIG. 4C) as (flow rate of HI/total flow rate)(%) of the mixed gas (where total flow rate is flow rate of HI plus flow rate of He) changes from 10% (point D in FIG. 4D: see FIG. 4A) through 20% (point E in FIG. 4D: see FIG. 4B) to 30% (point F in FIG. 4D: see FIG. 4C).

Accordingly, the angle θ of inclination of the via holes or recesses in the InP substrate below the resist mask can be controlled within the range of 90' to 45° by adjustment of (flow rate of HI/total flow rate) of the mixed gas within the range of 10% to 30%. Additionally, the etching rate can be controlled within a range of 300 nm/min to 1250 nm/min by adjustment of (flow rate of HI/total flow rate) of the mixed gas within a range of 10% to 30%.

In the dry etching apparatus of the first embodiment, as shown in FIG. 5D, where high-frequency power applied to the discharge coil is from 700 to 900 W, where flow rates; of mixed gas HI/He are 30/120 SCCM, and where a degree of vacuum in the reaction chamber 1 is 2 Pa, an angle θ of inclination of via holes or recesses in an InP substrate below a resist mask changes from 90 (point H in FIG. 5D: see FIG. 5A) through 65° (point I in FIG. 5D: see FIG. 5B) to 45° (point J in FIG. 5D: see FIG. 5C) as bias high-frequency power applied to the substrate changes from 200 W (point H in FIG. 5D: see FIG. 5A) through 150 W (point I in FIG. 5D: see FIG. 5B) to 100 W (point J in FIG. 5D: see FIG. 5C). On the same condition, an etching rate changes from 3000 nm/min (point H in FIG. 5D: see FIG. 5A) through 1600 nm/min (point I in FIG. 5D: see FIG. 5B) to 800 nm/min (point J in FIG. 5D: see FIG. 5C) as a bias high-frequency power applied to the substrate changes from 200 W (point H in FIG. 5D: see FIG. 5A) through 150 W (point I in FIG. 5D: see FIG. 5B) to 100 W (point J in FIG. 5D: see FIG. 5C).

Accordingly, the angle θ of inclination of the via holes or recesses in the InP substrate below the resist mask can be controlled within a range of 90° to 45° by adjustment of the bias high-frequency power applied to the substrate within a range of 200 W to 100 W. Additionally, the etching rate can be controlled within a range of 3000 nm/min to 800 nm/min by adjustment of the bias high-frequency power applied to the substrate within a range of 200 W to 100 W.

Figure 6:
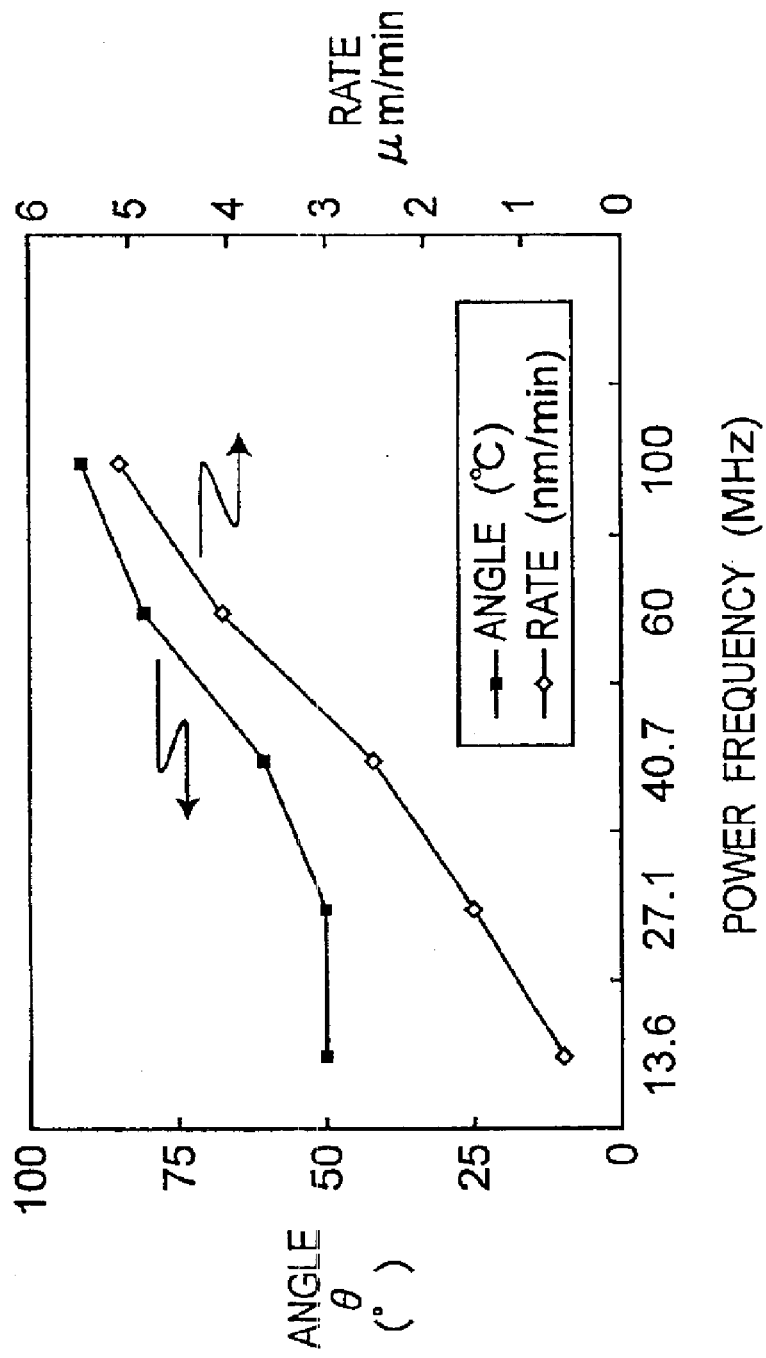
FIG. 6 is a view showing a relationship between frequencies of high-frequency power applied to a discharge coil and angles of inclination of via holes or recesses in an InP substrate below a resist mask, and a relationship between frequencies of high-frequency power applied to the discharge coil and etching rates in the dry etching apparatus for practicing the dry etching method of the first embodiment.

In the dry etching apparatus of the first embodiment, as shown in FIG. 6, where bias high-frequency power applied to an InP substrate is from 100 to 150 W, where flow rates of mixed gas HI/He are 30/120 SCCM, and where a degree of vacuum in the reaction chamber 1 is 2 Pa, an angle θ of inclination of via holes or recesses in the InP substrate below the resist mask changes from 50° through 50°, 68°, and 80° to 90° as a frequency of high-frequency power applied to the discharge coil changes from 13.6 MHz through 27.1 MHz, 40.7 MHz, and 60 MHz to 100 MHz. On the same condition, an etching rate changes from 0.5 μm/min through 1.3 μm/min, 2.2 μm/min, and 4 μm/min to 5 μm/min as a frequency of high-frequency power applied to the discharge coil changes from 13.6 MHz through 27.1 MHz, 40.7 MHz, and 60 MHz to 100 MHz.

Figure 7B:
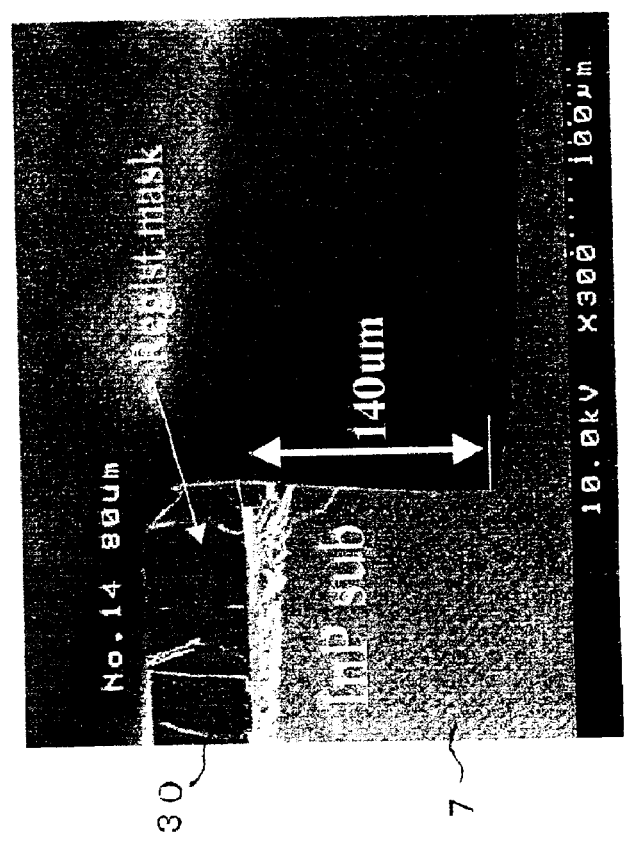
FIG. 7A and FIG. 7B are a sectional view and a perspective view, respectively, as a working example in which a resin resist mask having a thickness of 80 $\mu$m has been placed on an InP substrate and in which a region of the InP substrate without the resin resist mask has been etched deeply to 140 $\mu$m, in results of dry etching performed by the dry etching apparatus for practicing the dry etching method of the first embodiment.
Figure 7A:
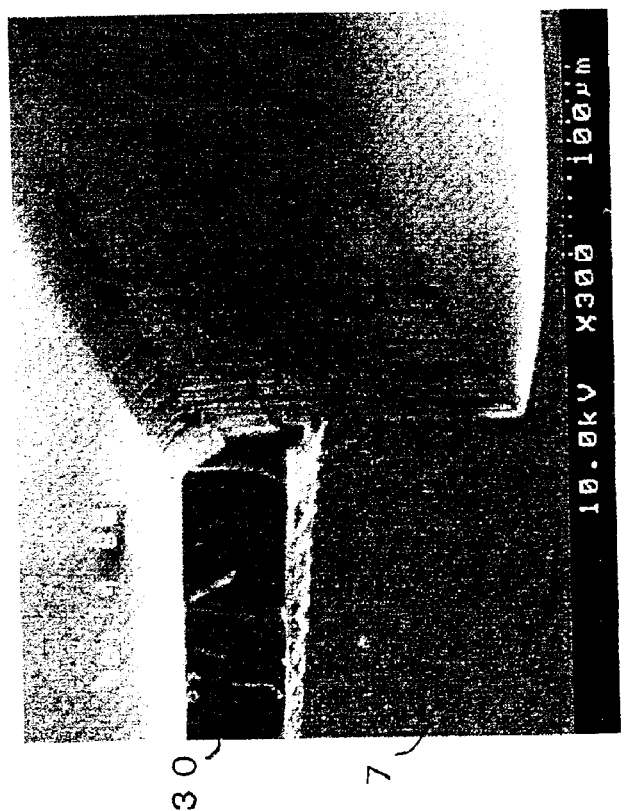

Accordingly, the angle θ of inclination of the via holes or recesses in the InP substrate below the resist mask can be controlled within a range of 50° to 90° by adjustment of the frequency of high-frequency power applied to the discharge coil within a range of 13.6 MHz to 100 MHz. Additionally, the etching rate can be controlled within a range of 0.5 μm/min to 5 μm/min by adjustment of the frequency of high-frequency power applied to the discharge coil within a range of 13.6 MHz to 100 MHz.

in FIG. 7A and FIG. 7B are shown a sectional view and a perspective view, respectively, as a working example in which a resin resist mask having a thickness of 80 μm has been placed on an InP substrate, and in which a region of the InP substrate without the resin resist mask has been etched deeply to 140 μm. An etching rate in this process is 1.4 μm/min, mixed gas is of HI/He, a surface temperature of the substrate is 100° C., and a selection ratio is 5.

The present invention is not limited to the above embodiment but may be implemented in other various aspects.

Figure 2:
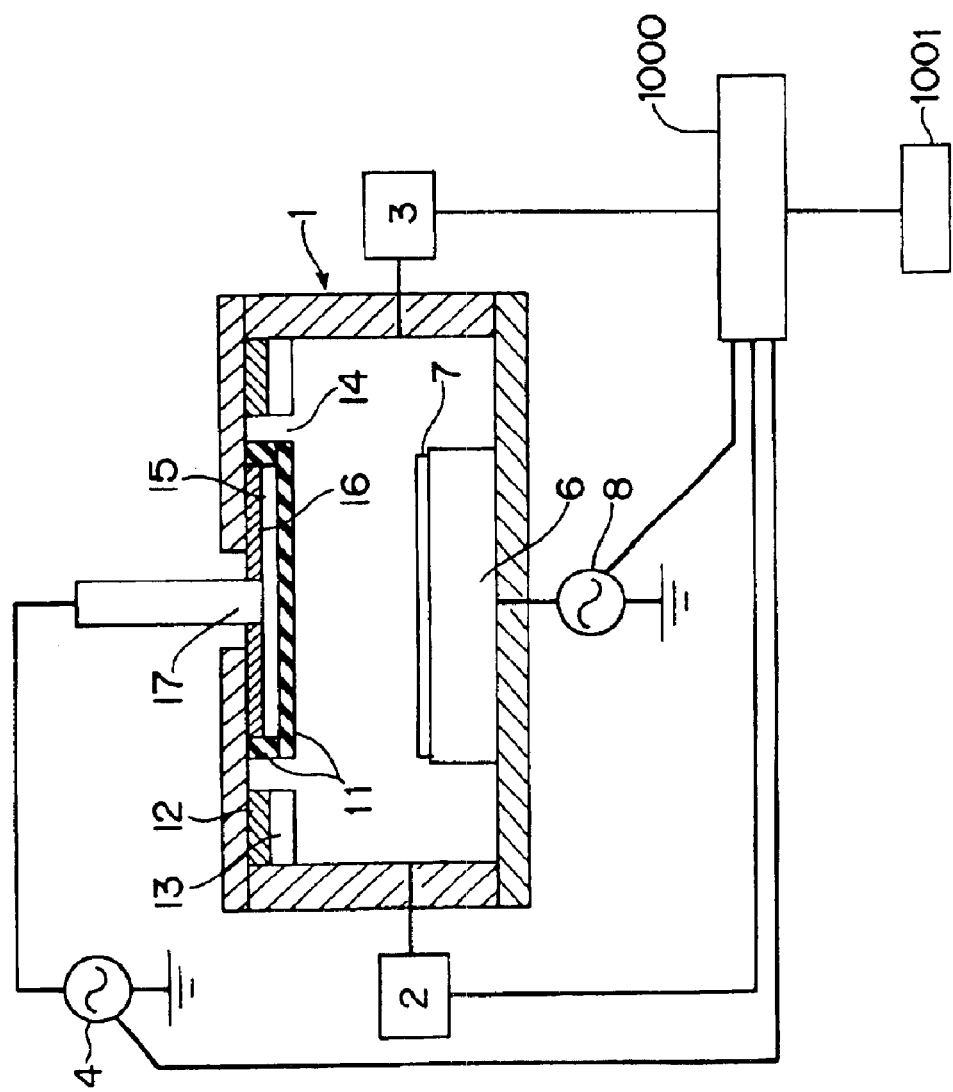
FIG. 2 is a schematic illustration of a dry etching apparatus for practicing a dry etching method of a second embodiment of the present invention.

In a dry etching apparatus for practicing a dry etching method of a second embodiment of the present invention, an antenna may be used in place of the discharge coil, for example, depending on conditions concerning etching (e.g., on condition that a frequency of high-frequency power applied to the discharge coil is 100 MHz). FIG. 2 is a sectional view of a plate-like antenna type plasma treatment apparatus. In FIG. 2, predetermined gas is introduced into a vacuum chamber 1, as an example of a reaction chamber, from a gas feeding device 2 and exhaust of the reaction chamber is performed by a pump 3, as an example of an exhaust device, so that an interior of the vacuum chamber 1 is held under a predetermined pressure, a predetermined high-frequency power (e.g., with a frequency of 100 MHz) is supplied to an antenna 15, by a high-frequency power source 4 for the antenna, through a through hole 17 provided in a dielectric plate 16 that is interposed between the antenna 15 and the vacuum chamber 1 and that is generally equal in outside dimensions to the antenna 15, and plasma is then produced in the vacuum chamber 1, so that a plasma treatment such as dry etching, deposition, or surface reforming can be executed on a substrate 7 of an InP-based compound semiconductor located on a substrate electrode 6. In this second embodiment, plasma treatment is executed for performing an etching treatment. In this case, ion energy that reaches the substrate 7 can be controlled by supply of high-frequency power to the substrate electrode 6 from a high-frequency power source 8 for the substrate electrode. A surface of the antenna 15 is covered with an insulation cover 11. A plasma trap 14 is provided, which is composed of a grooved space between the dielectric plate 16 and a dielectric ring 12 provided around the dielectric plate 16, and of a grooved space between the antenna 15 and a conducting ring 13 provided around the antenna 15. With such a constitution, electromagnetic waves emitted from the antenna 5 are intensified by the plasma trap 14, and high-density plasma (hollow cathode discharge) is apt to be generated in the plasma trap 14 surrounded by solid surfaces because low-electron-temperature plasma tends to cause hollow cathode discharge. Accordingly, a plasma density in the plasma trap 14 is highest in the vacuum chamber 1 and transportation of plasma to the vicinity of the substrate 7 with diffusion provides more uniform plasma. Practically, 100 MHz is most preferable for the dry etching apparatus and method of the second embodiment.

Control of operations of devices 2, 3, 4, 8, and the like in the dry etching apparatus in accordance with the second embodiment is constituted so as to be executed automatically by a control device 1000. On condition that pertinent information illustrated in FIG. 8 has been stored in a memory 1001 of the control device 1000 in advance, an operator is capable of making the apparatus execute dry etching, for example, at a desired angle of inclination or a desired etching rate on basis of the pertinent information, in control of the angle of inclination and the like under various conditions that will be described later.

Hereinbelow, working examples of the dry etching apparatus and method of the second embodiment will be described.

In an example, a frequency of high-frequency power that is applied to the antenna is from 27.12 to 100 MHz, a frequency of bias high-frequency power that is applied to an InP substrate is 500 kHz, gas that is selected from four types of gas of inert gas, gas containing $BCl_3$, gas containing HBr, and gas containing HCl, with this selected gas being added to gas containing $Cl_2$, is used as etching gas, at least 100 μm deep etching fabrication is thus performed at 150 to 200° C. in a region of the substrate on which a resin resist mask does not reside, and slopes having an angle of inclination between 90 and 70 degrees are formed with etching fabrication in via holes or recesses in the region on which the resin resist mask does not reside. An etching rate in this process is not larger than 5 μm/min, a selection ratio (etching of InP/etching of mask) is not less than 10, and such a high etching rate and a high selection ratio can be achieved. With use of 100 MHz as the frequency of the high-frequency power, the selection ratio is improved (for example, can be made larger than 10 though has conventionally been able to be increased so as to be no more than on the order of 3 or 4) and the etching rate can be increased (for example, can be increased to 5 μm/min though has been less than 1 μm/min at maximum). In another example of the dry etching apparatus and method of the second embodiment, a degree of vacuum in the reaction chamber is not higher than 0.5 Pa and is preferably 0.3 Pa, a frequency of high-frequency power that is applied to the antenna is 100 MHz. (900 W or less), a frequency of bias high-frequency power that is applied to an InP substrate is 500 kHz (400 W or less), gas that is selected from four types of gas of inert gas, gas containing $BCl_3$, gas containing HBr, and gas containing HCl, with this selected gas added to gas containing $Cl_2$, is used as etching gas, a surface temperature of the substrate is, for example, at most 150° C. and is preferably at most 80° C. (with a selection ratio not smaller than about 2), and the selection ratio is not smaller than about 5 and is preferably not smaller than 10.

Figure 8:
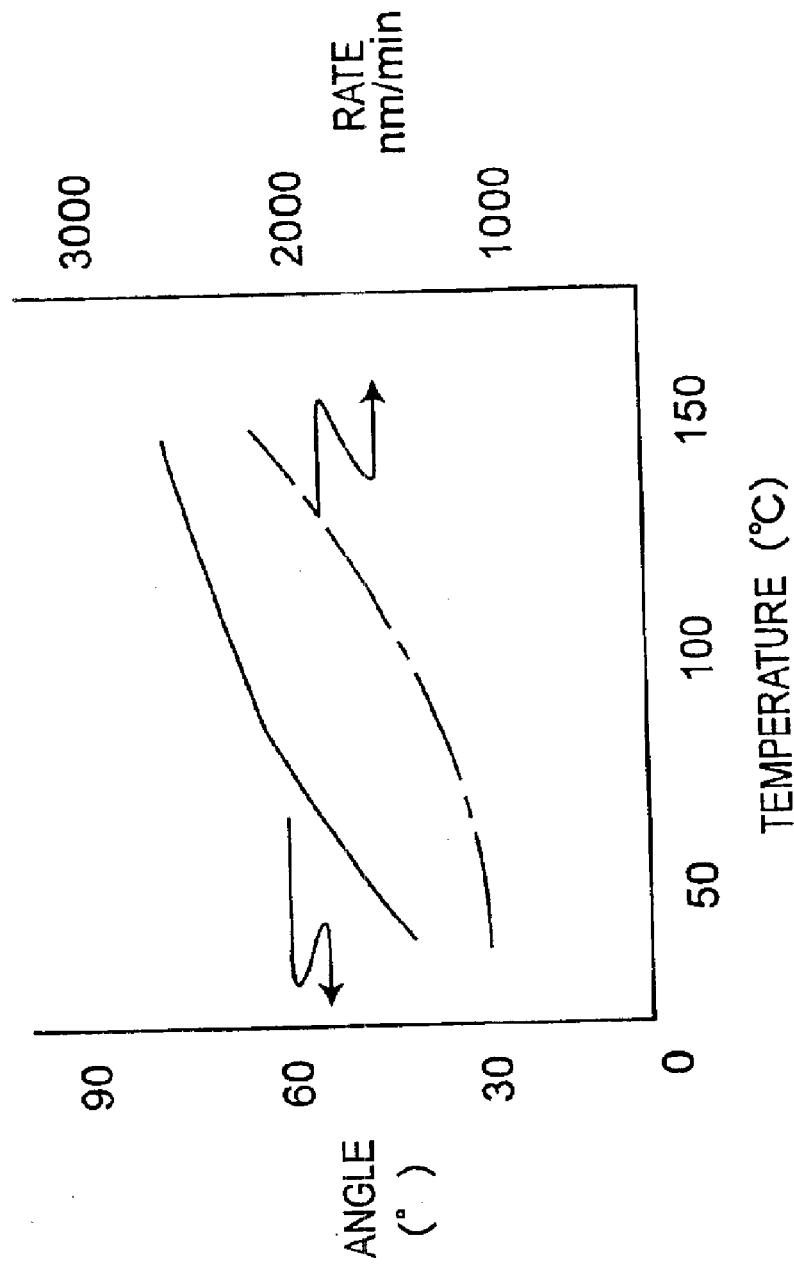
FIG. 8 is a diagram showing a relationship between surface temperatures of an InP substrate and angles of inclination of via holes or recesses in the InP substrate below a resist mask, and a relationship between surface temperatures of the substrate and etching rates in the dry etching apparatus for practicing the dry etching method of the second embodiment.

In the working examples of the dry etching apparatus and method of the second embodiment, as shown in FIG. 8, where high-frequency power applied to the antenna is from 500 to 900 W, where bias high-frequency power applied to the substrate is from 300 to 400 W, where flow rates of mixed gas $Cl_2$/Ar are 30/30 SCCM, and where a degree of vacuum in the reaction chamber 1 is 0.3 Pa, an angle θ of: inclination of via holes or recesses in the InP substrate below the resist mask changes from 50 through 65° to 80° as a surface temperature of the substrate changes from 50° C. through 100° C. to 150° C. On the same condition, an etching rate also changes from 1100 nm/min through 1500 nm/min to 2000 nm/min as the surface temperature of the substrate changes from 50° C. through 100° C. to 150° C.

Accordingly, an angle θ of inclination of via holes or recesses in the InP substrate below the resist mask can be controlled within a range of 50 to 80° by adjustment; of the surface temperature of the substrate within a range of 50° C. to 150° C. Additionally, the etching rate can be controlled within a range of 1100 nm/min to 2000 nm/min by adjustment of the surface temperature of the substrate within a range of 50° C. to 150° C.

Figure 9B:
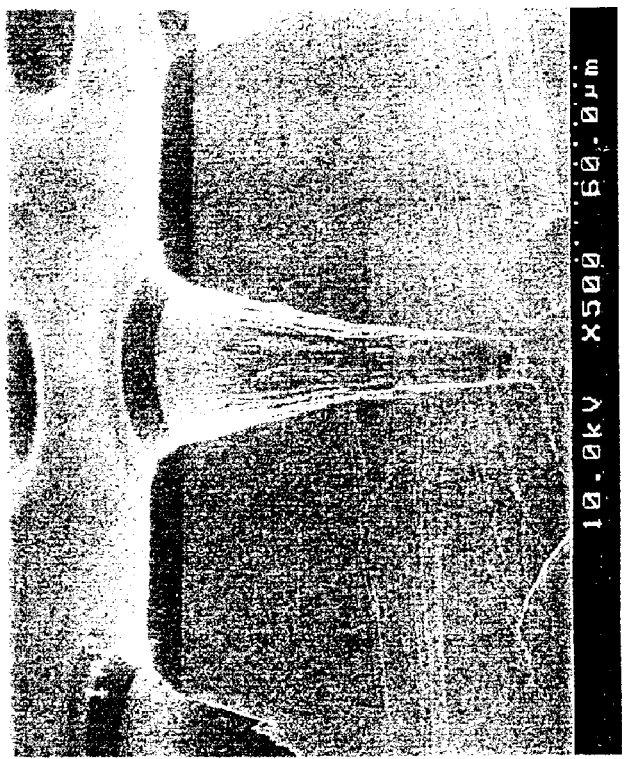
FIG. 9A and FIG. 9B are a sectional view and a perspective view, respectively, as a working example in which a heat resistant resin resist mask having a thickness of 27 $\mu$m has been placed on an InP substrate and in which a region of the InP substrate without the resin resist mask has been etched deeply to 105 $\mu$m in a shape of an inverted cone in general with a diameter of 30 $\mu$m, in results of dry etching performed by the dry etching apparatus for practicing the dry etching method of the second embodiment.
Figure 9A:
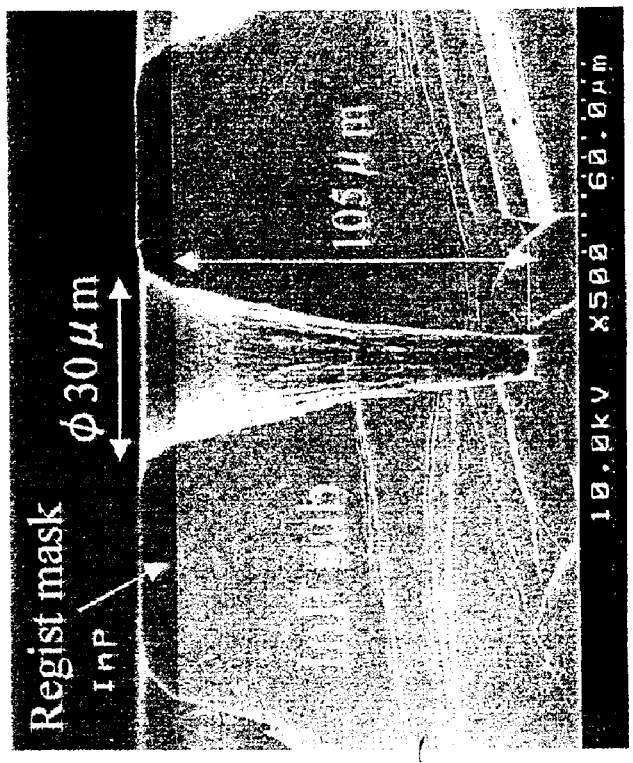
Figure 10A:
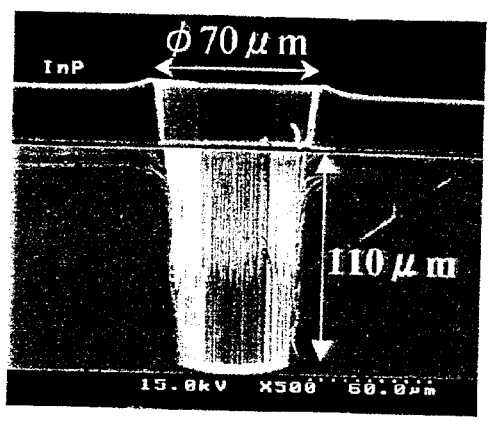
FIG. 10A, FIG. 10B, FIG. 10C, and FIG. 10D are a sectional view and a perspective view, respectively, as a working example in which a heat resistant resin resist mask having a thickness of 27 $\mu$m has been placed on an InP substrate and in which a region of the InP substrate without the resin resist mask has been etched deeply to 110 $\mu$m in a generally columnar shape with a diameter of 70 $\mu$m, and a sectional view and a perspective view, respectively, in which the region has been etched deeply to 100 $\mu$m in a generally columnar shape with a diameter of 30 $\mu$m, in results of dry etching performed by the dry etching apparatus for practicing the dry etching method of the second embodiment.
Figure 10B:
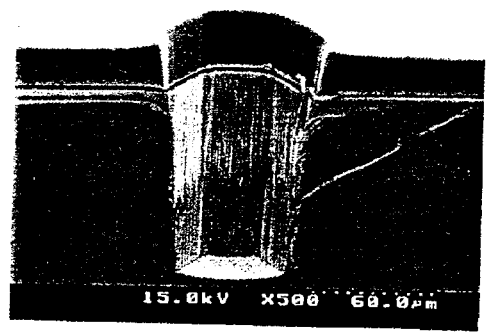
Figure 10C:
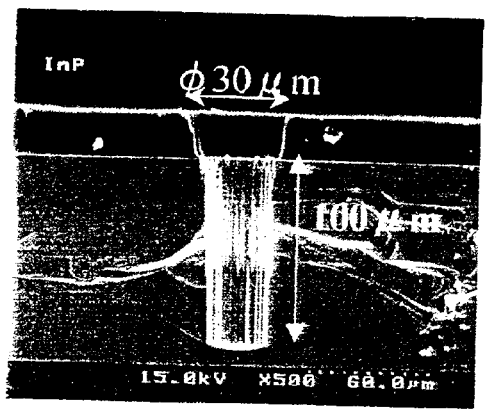
Figure 10D:
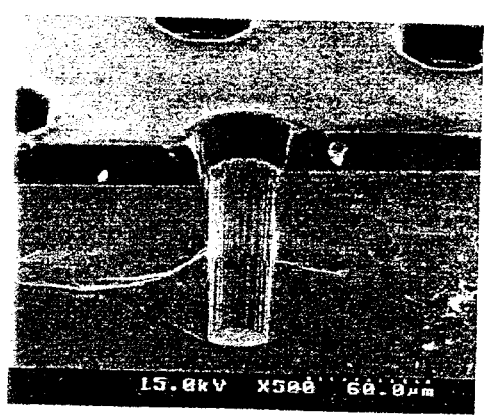

In FIG. 9A and FIG. 9B are shown a sectional view and a perspective view, respectively, as a working example in which a heat resistant resin resist mask having a thickness of 27 μm has been placed on an InP substrate, and in which a region of the InP substrate without the resin resist mask has been etched deeply to 105 μm in a shape of an inverted cone in general with a diameter of 30 μm. An etching rate in this process is 1.6 μm/min, mixed gas is $Cl_2$/Ar, a surface temperature of the substrate is 100° C., and a selection ratio is 6.

In FIG. 10A, FIG. 10B, FIG. 10C, and FIG. 10D, as working examples, are shown a sectional view and a perspective view, respectively, in which a heat resistant resin resist mask having a thickness of 27 μm has been placed on an InP substrate, and in which a region of the InP substrate without the resin resist mask has been etched deeply to 110 μm in a generally columnar shape with a diameter of 70 μm, and a sectional view and a perspective view, respectively, in which the region has been etched deeply to 100 μm in a generally columnar shape with a diameter of 30 μm. Etching rates in these processes are 4.5 μm/min and 4 μm/min, mixed gases are $Cl_2$/Ar and $Cl_2$/Ar, surface temperatures of the substrate are 150° C. and 150° C., and selection ratios are not less than 10 and not less than 10, respectively.

Among examples of the InP-based compound semiconductor substrates in the embodiments are compound semiconductor substrates of InGaAsP, InGaP, InAsP, and the like. Thicknesses of the resin resist masks that are placed on the substrates in the embodiments are required to be at least 10 μm and, on condition that the selection ratio is 10, use of a resin resist mask having a thickness of 10 μm allows deep etching of up to 100 μm to be performed.

To be brief, the dry etching apparatus and method of the first embodiment make possible a dry etching treatment at temperatures not higher than 140° C. that allow for use of inexpensive resin resist masks suitable for mass production, eliminate necessity for use of expensive masks made of metal, and achieve dry etching treatment of the InP-based compound semiconductor substrates with satisfactory fabricability, with use of mixed gas of hydrogen iodide gas and an inert gas as the etching gas.

By contrast, the dry etching apparatus and method of the second embodiment are most suitable for high-speed dry etching treatment and achieve a high selection ratio. Additionally, plasma temperature can be decreased, damage to a resist can be decreased, and a selection ratio on the resist can be increased (for example, can be increased to at least 5), in comparison with those of the dry etching apparatus and method of the first embodiment (the selection ratio has conventionally been able to be increased to no more than about 1, even with heating to about of 200° C.) The second embodiment is therefore suitable for at least 100 μm deep etching fabrication. As a result of the high selection ratio on resist film, at least 100 μm deep etching fabrication can be performed even if a thickness of the resist film is small (for example, on the order of 10 to 20 μm). By use of the high selection ratio, therefore, at least 200 μm deep etching fabrication can be performed with a diameter of at least 30 μm.

Figure 11:
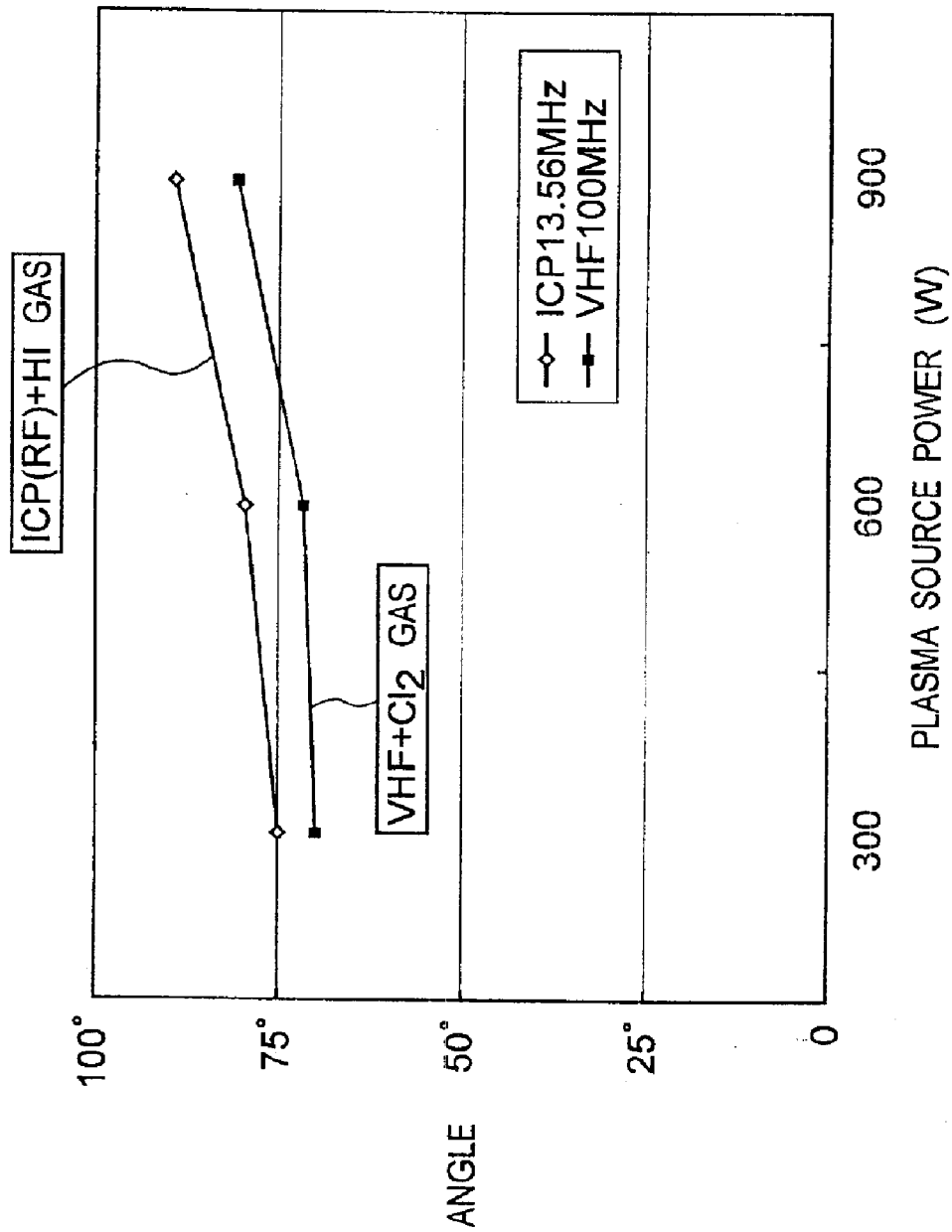
FIG. 11 is a diagram showing relationships between high-frequency power applied to the discharge coil and angles of inclination of via holes or recesses in an InP substrate below a resist mask in the dry etching apparatus for practicing the dry etching methods of the first and second embodiments.

In the dry etching apparatus of the first and second embodiments, as shown in FIG. 11, where the bias high-frequency power applied to the substrate is from 100 to 200 W, where the flow rates of the mixed gas HI/He are 30/120 SCCM and the flow rates of the $Cl_2$/Ar are 40/30 SCCM, where the degree of vacuum in the reaction chamber 1 is not more than 0.3 Pa, and where the frequencies of the high-frequency power applied to the discharge coil or the antenna are 13.6 MHz and 100 MHz, the angles θ of inclination of the via holes or recesses in the InP substrate below the resist mask change from 75° through 80° to 90°, or: from 70° through 73° to 80°, as high-frequency power applied to the discharge coil or the antenna changes from 300 W through 600 W to 900 W.

Accordingly, the angle θ of inclination of the via holes or recesses in the InP substrate below the resist mask can be controlled within a range of 75° through 80° to 90° by adjustment of the high-frequency power applied to the discharge coil within a range of 300 through 600 to 900 W on condition that the frequency of the high-frequency power applied to the discharge coil is 13.6 MHz. Besides, the angle θ of inclination of the via holes or recesses in the InP substrate below the resist mask can be controlled within a range of 70° through 73° to 60° by adjustment of the high-frequency power applied to the antenna within a range of 300 through 600 to 900 W on condition that the frequency of the high-frequency power applied to the antenna is 100 MHz.

With an appropriate combination of arbitrary embodiments among the various embodiments, effects thereof can be achieved.

In accordance with the present invention, the at least 13.56 MHz high-frequency power is applied to the flat spiral discharge coil or antenna, and the high-frequency voltage is applied to the substrate electrode by the high-frequency power source for the substrate electrode. Both are independently controlled and etching gas is appropriately selected, and thus at least 20 μm deep etching fabrication that has practically been unachievable in conventional RIE plasma treatment and, more preferably, at least 100 μm fabrication can rapidly be performed on an InP-based compound semiconductor substrate. In conventional RIE plasma treatment, an upper electrode is grounded, 13.56 MHz high-frequency power is applied to a substrate, and an etching rate is increased to about 10 nm/min by treatment at a high temperature of 250° C. with a mixed gas of $CH_4$ and $H_2$; however, 10 nm/min is too low for deep etching fabrication and makes practically impossible the at least 20 μm, more preferably, at least 100 μm deep etching fabrication. In the present invention, by contrast, an etching rate can be increased to several tens or several hundreds of times the conventional rate (for example, to 1000 nm/min).

High temperatures on the order of 250° C. for increase in rate of treatment require 20 μm of $SiO_2$ as a mask to be formed on a surface of an InP-based compound semiconductor substrate by performance of an additional CVD process because a resistible temperature of a resist mask placed on the surface of the substrate and made of resin is as low as on the order of 120 to 130° C. Thus, the additional CVD process is conventionally required. By contrast, the present invention can be practiced at temperatures not higher than 140° C., for example, at ordinary temperatures, and therefore allows a resist mask made of resin to be adequately used, avoids necessity to form the $SiO_2$ mask by the CVD process and thus avoids necessity of the additional CVD process.

In accordance with the present invention, mirror finish of surfaces of substrates can be achieved, and thus a damageless feature can be attained.

In accordance with the present invention, switches of etching gas to gas of a different type in performance of an etching treatment make it possible to change an angle of inclination of via holes or recesses that are formed in a substrate, and make it possible to control fabrication shape into a desired shape.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A dry etching method comprising:

feeding a mixed gas of hydrogen iodide gas and a gas selected from the group consisting of inert gas, gas containing $Cl_2$, gas containing $BCl_3$, gas containing HBr and gas containing HCl into a reaction chamber and exhausting gas from said reaction chamber such that a pressure within said reaction chamber is controlled to be less than a predetermined pressure;

generating plasma from said mixed gas within said reaction chamber by applying at least 13.56 MHz high-frequency power to a flat spiral discharge coil facing an InP-based compound semiconductor substrate positioned on a substrate electrode within said reaction chamber; and using said plasma to etch said InP-based compound semiconductor substrate while controlling a density of said plasma via said high-frequency power applied to said flat spiral discharge coil and while independently controlling ion energy reaching said InP-based compound semiconductor substrate by applying a high-frequency voltage to said substrate electrode via a high-frequency power source.

2. The dry etching method according to claim 1, wherein applying at least 13.56 MHz high-frequency power to a flat spiral discharge coil comprises applying to said flat spiral discharge coil high-frequency power having a frequency of 13.56 MHz, applying a high-frequency voltage to said substrate electrode via a high-frequency power source comprises applying a bias to said InP-based compound semiconductor substrate that has a frequency of 13.56 MHz, and using said plasma to etch said InP-based compound semiconductor substrate comprises using said plasma to etch via holes or recesses in said InP-based compound semiconductor substrate below a resist mask, with a depth of said via holes or recesses being at least 100 μm and an angle of inclination of said via holes or recesses being within a range of from 90° to 70°.

3. The dry etching method according to claim 1, wherein feeding a mixed gas of hydrogen iodide gas and a gas selected from the group consisting of inert gas, gas containing $Cl_2$, gas containing $BCl_3$, gas containing HBr and gas containing HCl into a reaction chamber comprises feeding a mixed gas of hydrogen iodide gas and inert gas into said reaction chamber.

4. The dry etching method according to claim 3, wherein using said plasma to etch said InP-based compound semiconductor substrate comprises using said plasma to etch first via holes or recesses in said InP-based compound semiconductor substrate, and further comprising:

feeding a different gas into said reaction chamber and exhausting gas from said reaction chamber such that a pressure within said reaction chamber is controlled to be less than a predetermined pressure;

generating other plasma from said different gas within said reaction chamber by applying at least 13.56 MHz high-frequency power to said flat spiral discharge coil facing said InP-based compound semiconductor substrate positioned on said substrate electrode within said reaction chamber; and using said other plasma to etch second via holes or recesses in said InP-based compound semiconductor substrate while controlling a density of said other plasma via said high-frequency power applied to said flat spiral discharge coil and while independently controlling ion energy reaching said InP-based compound semiconductor substrate by applying a high-frequency voltage to said substrate electrode via said a high-frequency power source, wherein an angle of inclination of said first via holes or recesses is different than an angle of inclination of said second via holes or recesses.

5. The dry etching method according to claim 4, wherein said different gas comprises a mixture of hydrogen iodide gas and a gas selected from the group consisting of gas containing $Cl_2$, gas containing $BCl_3$, gas containing HBr and gas containing HCl.

6. The dry etching method according to claim 3, wherein applying at least 13.56 MHz high-frequency power to a flat spiral discharge coil comprises applying one of 27.12 MHz high-frequency power, 40.68 MHz high-frequency power, 60 MHz high-frequency power, 80 MHz high-frequency power and 100 MHz high-frequency power to said flat spiral discharge coil.

7. The dry etching method according to claim 3, wherein feeding a mixed gas of hydrogen iodide gas and inert gas into said reaction chamber and exhausting gas from said reaction chamber such that a pressure within said reaction chamber is controlled to be less than a predetermined pressure comprises feeding said mixed gas into and exhausting said gas from said reaction chamber such that a vacuum within said reaction chamber is within a range of from 1 Pa to 4 Pa, whereby using said plasma to etch said InP-based compound semiconductor substrate comprises using said plasma to etch via holes or recesses in said InP-based compound semiconductor substrate below a resist mask, with an angle of inclination of said via holes or recesses being within a range of from 90° to 60°.

8. The dry etching method according to claim 3, wherein feeding a mixed gas of hydrogen iodide gas and inert gas into a reaction chamber comprises controlling a ratio of (flow rate of hydrogen iodide into said reaction chamber/flow rate of said mixed gas into said reaction chamber) to be within a range of from 10% to 30%, such that using said plasma to etch said InP-based compound semiconductor substrate comprises using said plasma to etch said InP-based compound semiconductor substrate at a rate within a range of from 300 nm/min to 1250 nm/min, whereby via holes or recesses are formed in said InP-based compound semiconductor substrate below a resist mask, with an angle of inclination of said via holes or recesses being within a range of from 90' to 45°.

9. The dry etching method according to claim 3, wherein applying a high-frequency voltage to said substrate electrode via a high-frequency power source results in applying to said InP-based compound semiconductor substrate a bias high-frequency power within a range of from 200 W to 100 W, such that using said plasma to etch said InP-based compound semiconductor substrate comprises using said plasma to etch said InP-based compound semiconductor substrate at a rate within a range of from 3000 nm/min to 800 nm/min, whereby via holes or recesses are formed in said InP-based compound semiconductor substrate below a resist mask, with an angle of inclination of said via holes or recesses being within a range of from 90° to 45°.

10. The dry etching method according to claim 3, wherein applying at least 13.56 MHz high-frequency power to a flat spiral discharge coil comprises applying to said flat spiral discharge coil high-frequency power having a frequency within a range of from 13.6 MHz to 100 MHz, such that using said plasma to etch said InP-based compound semiconductor substrate comprises using said plasma to etch said InP-based compound semiconductor substrate at a rate within a range of from 0.5 μm/min to 5 μm/min, whereby via holes or recesses are formed in said InP-based compound semiconductor substrate below a resist mask, with an angle of inclination of said via holes or recesses being within a range of from 50° to 90°.

11. The dry etching method according to claim 3, wherein applying at least 13.56 MHz high-frequency power to a flat spiral discharge coil comprises applying to said flat spiral discharge coil high-frequency power having a frequency within a UHF band of from 300 MHz to 3 GHz.

12. The dry etching method according to claim 3, wherein applying a high-frequency voltage to said substrate electrode via a high-frequency power source comprises applying a bias to said InP-based compound semiconductor substrate that has a frequency of at most 13.56 MHz.

13. The dry etching method according to claim 3, wherein applying a high-frequency voltage to said substrate electrode via a high-frequency power source comprises applying a bias to said InP-based compound semiconductor substrate that has a frequency of one of 13.56 MHz, 2 MHz, 800 kHz and 500 kHz.

14. The dry etching method according to claim 3, wherein feeding a mixed gas of hydrogen iodide gas and inert gas into said reaction chamber and exhausting gas from said reaction chamber such that a pressure within said reaction chamber is controlled to be less than a predetermined pressure comprises feeding said mixed gas into and exhausting said gas from said reaction chamber such that a vacuum within said reaction chamber is within a range of from 0.1 Pa to 0.5 Pa.

15. The dry etching method according to claim 3, wherein feeding a mixed gas of hydrogen iodide gas and inert gas into said reaction chamber and exhausting gas from said reaction chamber such that a pressure within said reaction chamber is controlled to be less than a predetermined pressure comprises feeding said mixed gas into and exhausting said gas from said reaction chamber such that a vacuum within said reaction chamber is 0.3 Pa.

16. The dry etching method according to claim 3, wherein using said plasma to etch said InP-based compound semiconductor substrate comprises using said plasma to etch said InP-based compound semiconductor substrate while maintaining a surface temperature of said InP-based compound semiconductor substrate to be within a range such that a resin resist can be used.

17. A dry etching method comprising:

feeding a mixed gas of inert gas and a gas containing one of chlorine, hydrogen bromide and hydrogen chloride into a reaction chamber and exhausting gas from said reaction chamber such that a pressure within said reaction chamber is controlled to be less than a predetermined pressure;

generating plasma from said mixed gas within said reaction chamber by applying at least 13.56 MHz high-frequency power to a flat antenna facing an InP-based compound semiconductor substrate positioned on a substrate electrode within said reaction chamber; and using said plasma to etch said InP-based compound semiconductor substrate while controlling a density of said plasma via said high-frequency power applied to said flat antenna and while independently controlling ion energy reaching said InP-based compound semiconductor substrate by applying a high-frequency voltage to said substrate electrode via a high-frequency power source, wherein using said plasma to etch said InP-based compound semiconductor substrate comprises using said plasma to etch said InP-based compound semiconductor substrate, having a surface temperature within a range of from 50° C. to to 150° C., at a rate within a range of from 1100 nm/min to 2000 nm/min, whereby via holes or recesses are formed in said InP-based compound semiconductor substrate below a resist mask, with an angle of inclination of said via holes or recesses being in a range of from 50° to 80°.

18. The dry etching method according to claim 17, wherein applying at least 13.56 MHz high-frequency power to a flat antenna comprises applying to said flat antenna high-frequency power having a frequency within a UHF band of from 300 MHz to 3 GHz.

19. The dry etching method according to claim 17, wherein applying a high-frequency voltage to said substrate electrode via a high-frequency power source comprises applying a bias to said InP-based compound semiconductor substrate that has a frequency of at most 13.56 MHz.

20. The dry etching method according to claim 17, wherein applying a high-frequency voltage to said substrate electrode via a high-frequency power source comprises applying a bias to said InP-based compound semiconductor substrate that has a frequency of one of 13.56 MHz, 2 MHz, 800 kHz and 500 kHz.

* * * * *

UNITED STATES PATENT AND TRADEMARK OFFICE
CERTIFICATE OF CORRECTION

PATENT NO. : 6,893,971 B2
DATED : May 17, 2005
INVENTOR(S) : Hiroshi Tanabe et al.

It is certified that error appears in the above-identified patent and that said Letters Patent is hereby corrected as shown below:

Column 17,
Line 27, change "90" to -- 90° --.

Signed and Sealed this

Twenty-third Day of August, 2005

JON W. DUDAS
*Director of the United States Patent and Trademark Office*